(12) United States Patent
Han

(10) Patent No.: US 7,514,326 B2
(45) Date of Patent: Apr. 7, 2009

(54) ORGANIC THIN FILM TRANSISTOR, DISPLAY DEVICE USING THE SAME AND METHOD OF FABRICATING THE SAME

(75) Inventor: Chang Wook Han, Seoul (KR)

(73) Assignee: LG Display Co., Ltd, Seoul (KR)

( * ) Notice: Subject to any disclaimer, the term of this patent is extended or adjusted under 35 U.S.C. 154(b) by 61 days.

(21) Appl. No.: 11/432,554

(22) Filed: May 12, 2006

(65) Prior Publication Data

US 2006/0258070 A1  Nov. 16, 2006

(30) Foreign Application Priority Data

May 13, 2005  (KR)  ........................ 10-2005-0039969

(51) Int. Cl.
*H01L 21/336* (2006.01)
(52) U.S. Cl. .............................. 438/283; 257/E21.623; 257/E21.637
(58) Field of Classification Search ................. 438/283, 438/176, 157, 82, 99, 562, 623, 725, 780, 438/781, 789, 790, 794, 939, FOR. 135, FOR. 323; 257/E21.623, E21.637
See application file for complete search history.

(56) References Cited

U.S. PATENT DOCUMENTS

| | | | | |
|---|---|---|---|---|
| 5,500,537 A | * | 3/1996 | Tsumura et al. | 257/40 |
| 6,060,333 A | * | 5/2000 | Tanaka et al. | 438/30 |
| 6,620,655 B2 | * | 9/2003 | Ha et al. | 438/149 |
| 7,253,848 B2 | * | 8/2007 | Wong et al. | 349/43 |
| 7,336,031 B2 | * | 2/2008 | Chung et al. | 313/506 |
| 2006/0043359 A1 | * | 3/2006 | Masuda et al. | 257/40 |
| 2006/0267006 A1 | * | 11/2006 | Ando et al. | 257/40 |

OTHER PUBLICATIONS

Fast Organic Circuits on Flexible Polymeric Substrates, Sheraw et al. IEEE 2000.*

* cited by examiner

*Primary Examiner*—N Drew Richards
*Assistant Examiner*—Ankush K Singal
(74) *Attorney, Agent, or Firm*—Holland & Knight LLP

(57) ABSTRACT

An organic thin film transistor includes a dual gate electrode on a substrate, a gate insulating layer on the dual gate electrode, source and drain electrodes on the gate insulating layer, and an organic semiconductor layer on the source and drain electrodes.

16 Claims, 6 Drawing Sheets

UV or LASER

ORGANIC THIN FILM TRANSISTOR, DISPLAY DEVICE USING THE SAME AND METHOD OF FABRICATING THE SAME

The present invention claims the benefit of Korean Patent Application No. P2005-039969 filed in Korea on May 13, 2005, which is hereby incorporated by reference in its entirety.

BACKGROUND OF THE INVENTION

1. Field of the Invention

The present invention relates to a transistor, and more particularly, to an organic thin film transistor, a display device using the same and a method of fabricating the same. Although the present invention is suitable for a wide scope of applications, it is particularly suitable for forming an organic thin film transistor for a flexible display device.

2. Description of the Related Art

A thin film transistor (TFT) that is widely used in display devices generally includes an amorphous or polycrystalline silicon as a semiconductor layer, a silicon oxide layer as a gate insulating layer, and a metal layer as a gate electrode. Recently, with the development of a variety of semiconductive organic materials, many researchers world-wide are actively developing a TFT using an organic material as the semiconductor layer. The organic semiconductor material can be synthesized by various methods into polymer. Such an organic semiconductor material is flexible, inexpensive to produce, and easy to mold into a fiber or a film. Therefore, the organic semiconductor material is increasingly used in various types of display devices.

Recently, competition for developing a flexible LCD device is becoming intense. A flexible LCD device is portable because the flexible LCD device is thin and can be rolled-up. Accordingly, visual information can be conveniently viewed anytime and anywhere, if the flexible LCD device becomes practical and a network/storage capability is also implemented with such a practical flexible LCD device. The academic and the industrial community estimate that an early prototype flexible LCD device will enter the market next year and be popular by 2010.

In a flexible LCD device, both the display unit and the switching unit should have flexibility. Research is actively being conducted in replacing a glass substrate of prior display units with a plastic substrate to provide flexibility to the display unit. Further, research is actively being conducted in replacing the amorphous or polycrystalline silicon in the semiconductor layer of a prior TFT with an organic semiconductor material to form an organic thin film transistor (OTFT). However, forming the OTFT with the organic semiconductor material is more complex to produce since an additional process, such as a surface treatment, is required for patterning an organic semiconductor layer.

SUMMARY OF THE INVENTION

Accordingly, the present invention is directed to an organic thin film transistor, a display device using the same and a method of fabricating the same that substantially obviate one or more of the problems due to limitations and disadvantages of the related art.

An object of the present invention is to provide an organic thin film transistor, a display device using the same and a method of fabricating the same having a reduced number of process steps.

Another object of the present invention is to provide an organic thin film transistor, a display device using the same and a method of fabricating the same having reduced production costs.

Another object of the present invention is to provide an organic thin film transistor, a display device using the same and a method of fabricating the same having a reduced leakage current.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic thin film transistor including a dual gate electrode on a substrate, a gate insulating layer on the dual gate electrode, source and drain electrodes on the gate insulating layer, and an organic semiconductor layer on the source and drain electrodes.

In another aspect of the present invention, a method of fabricating an organic thin film transistor, the method includes forming a dual gate electrode on a substrate, forming a gate insulating layer on the dual gate electrode, forming, on the gate insulating layer, source and drain electrodes partially overlapping the dual gate electrode and spaced apart from each other, forming an organic semiconductor material on the source and drain electrodes, and irradiating light onto a backside of the substrate.

In a further aspect of the present invention, a display device includes a gate line and a gate electrode formed on a substrate, the gate line and the gate electrode being formed of a stack of a first gate line layer and a second gate line layer, a gate insulating layer on the gate electrode, a data line crossing the gate line on the gate insulating layer to define a pixel region, source and drain electrodes partially overlapping the gate electrode, an organic semiconductor layer on the source and drain electrodes and the data line, a passivation layer on the organic semiconductor layer including a contact hole exposing the drain electrode, and a pixel electrode on the passivation layer and connected through the contact hole to the drain electrode.

In a still further another aspect of the present invention, a method of fabricating a display device includes forming a gate line and a gate electrode on a substrate, the gate line and the gate electrode being formed of a stack of a first gate line layer and a second gate line layer, forming a gate insulating layer on the gate electrode, forming a data line crossing the gate line on the gate insulating layer to define a pixel region, and source and drain electrodes protruding from the date line to partially overlap the gate electrode, forming an organic semiconductor layer on the front side of the substrate, irradiating light onto the backside of the substrate, forming a passivation layer on the organic semiconductor layer, the passivation layer including a contact hole exposing the drain electrode; and forming a pixel electrode on passivation layer and connected through the contact hole to the drain electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
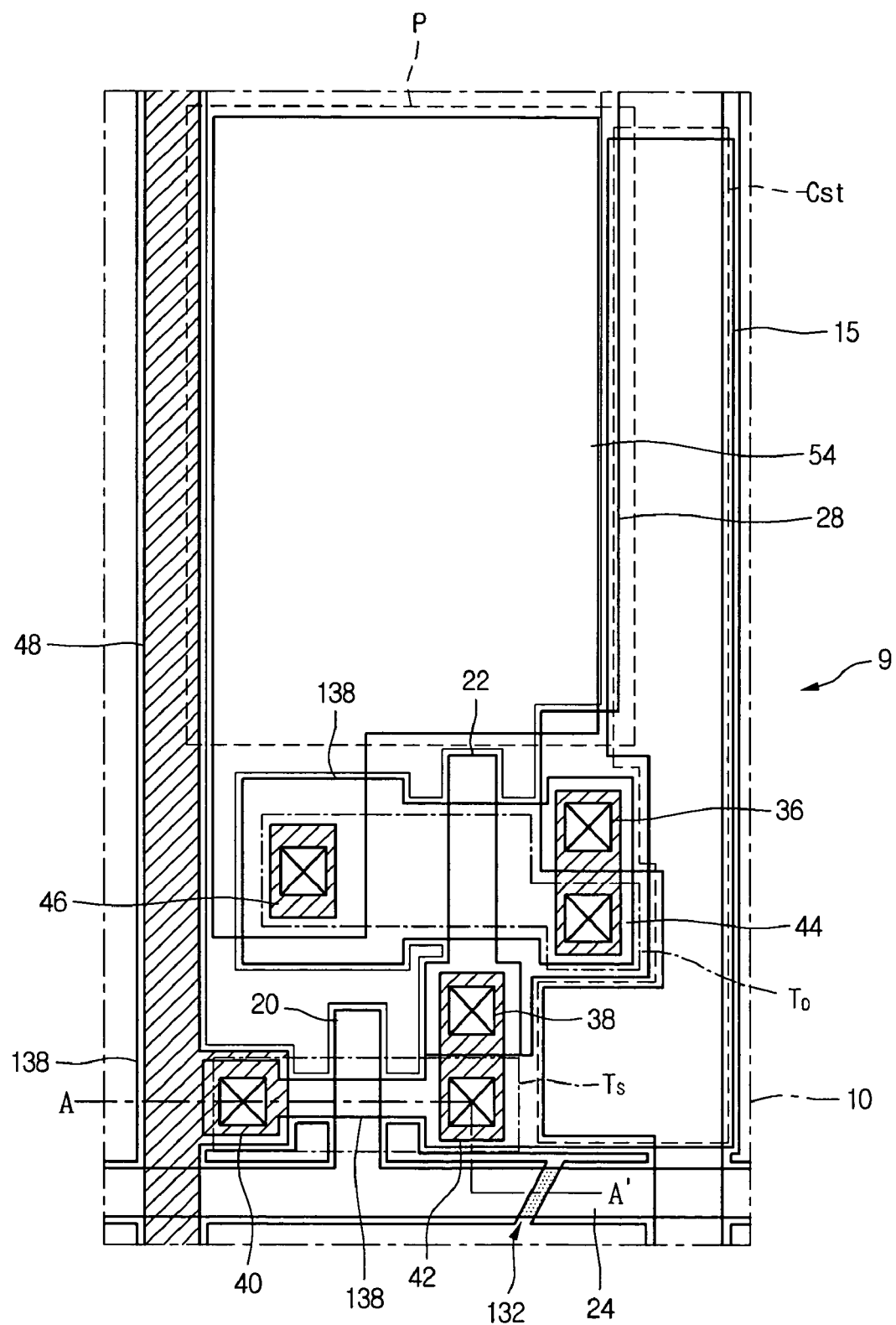
FIG. 1 is a plan view of an organic electroluminescence device according to an embodiment of the present invention.

FIG. 1 is a plan view of an organic electroluminescence device according to an embodiment of the present invention. As shown in FIG. 1, a plurality of pixels are defined on a substrate 10 in an organic electroluminescence device 9. Each of the pixels in an organic electroluminescence device 9 includes a switching device $T_S$ and a driving device $T_D$. In the alternative, depending on operational characteristics of the organic electroluminescence device 9, each of the switching device $T_S$ and the driving device $T_D$ may be configured to include one or more thin film transistors (TFTs).

A plurality of gate lines 24 are arranged in a first direction on the substrate 10 such that they are spaced apart from one another by a predetermined distance, as shown in FIG. 1. Data lines 48 are arranged in a second direction to cross the gate lines 24 with an insulating layer interposed between the gate lines 24 and the data lines 48. The crossing gate lines 24 and data lines 48 define the pixel region P. Also, a power line 28 is arranged in the first direction such that it is spaced apart from and disposed in parallel to the data line 48.

Each pixel region P includes the switching device $T_S$, the driving device $T_D$, and a storage device Cst. The switching device TS is a TFT, which includes a gate electrode 20, an organic semiconductor layer 138, a source electrode 40, and a drain electrode 42. Similarly, the driving device TD is a TFT, which includes a gate electrode 22, an organic semiconductor layer 138, a source electrode 44, and a drain electrode 46. The gate electrode 20 of the switching device TS is connected to the gate line 24, and the source electrode 40 of the switching device TS is connected to the data line 48. The drain electrode 42 of the switching device TS is connected through a contact hole 38 to the gate electrode 22 of the driving device $T_D$. The source electrode 44 of the driving device $T_D$ is connected through a contact hole 36 to the power line 28. The drain electrode 46 of the driving device $T_D$ contacts a first electrode 54 in the pixel region P (i.e., a portion of a region between the power line 28 and the data line 48. The power line 28 and a first electrode 15 under the power line 28 partially overlap each other to form a storage capacitor Cst.

Embodiments of present invention for an organic electroluminescence device are characterized in that the switching device $T_S$ is an organic thin film transistor (OTFT). That is, the organic semiconductor layer 138 is formed on the source electrode 40 and the drain electrode 42, which constitute the switching device $T_S$, to form a channel. The organic semiconductor layer 138 is formed also on the gate line 24 and the data line 48.

A cut portion 132 is formed in the organic semiconductor layer 138 on the gate line 24. One or more cut portions 132 may be provided in one pixel region P. The one or more cut portions 132 prevents a leakage current through the organic semiconductor layer 138 on the gate line 24.

The organic electroluminescence device 9 may be an active matrix type organic electroluminescence device. The OTFT may be used as a switching device provided in each pixel area of the active matrix type organic electroluminescence device. The OTFT may also be used as a switching device of an active matrix type LCD.

Figure 2:
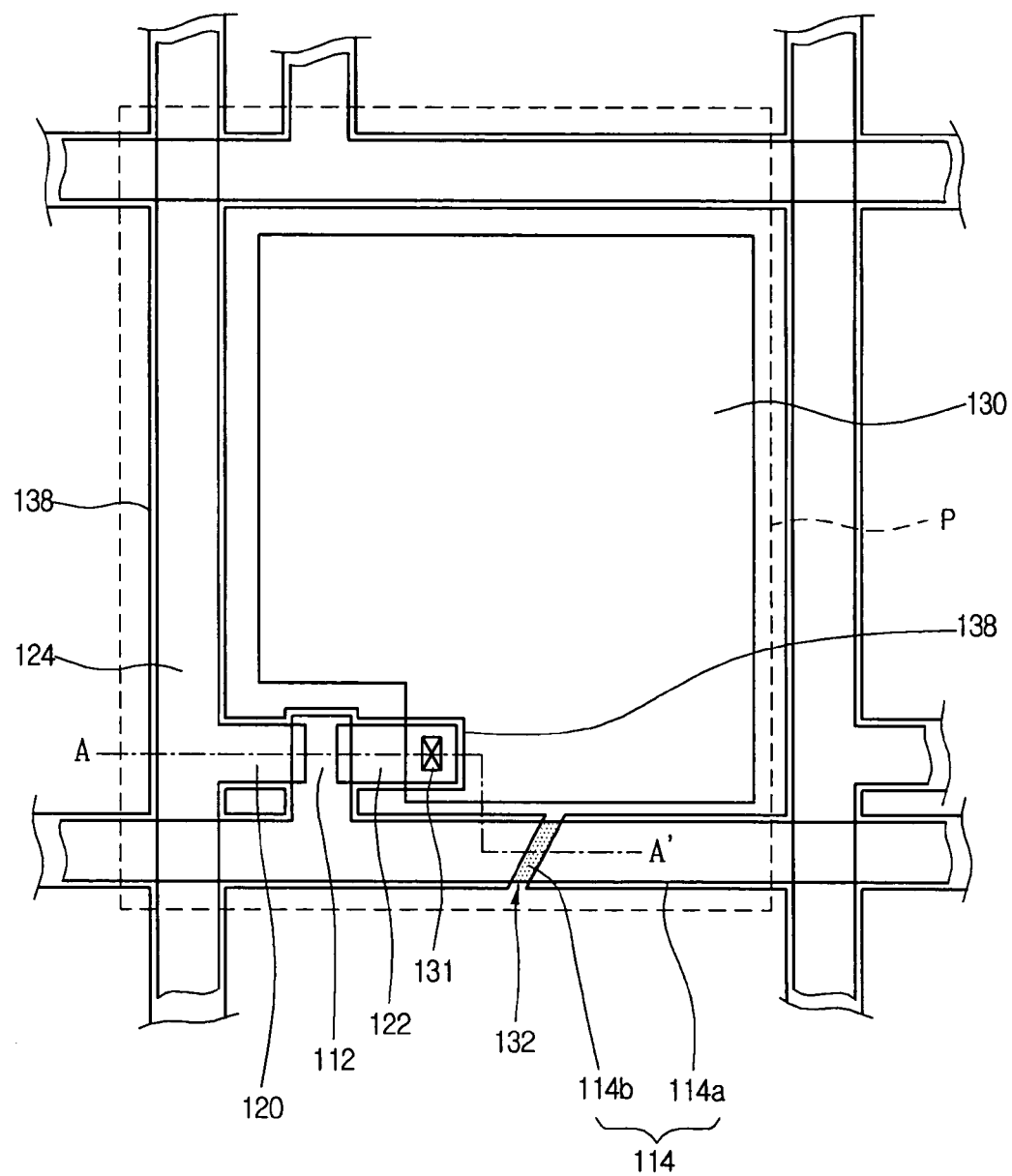
FIG. 2 is a plan view of an LCD according to another embodiment of the present invention.
Figure 3:
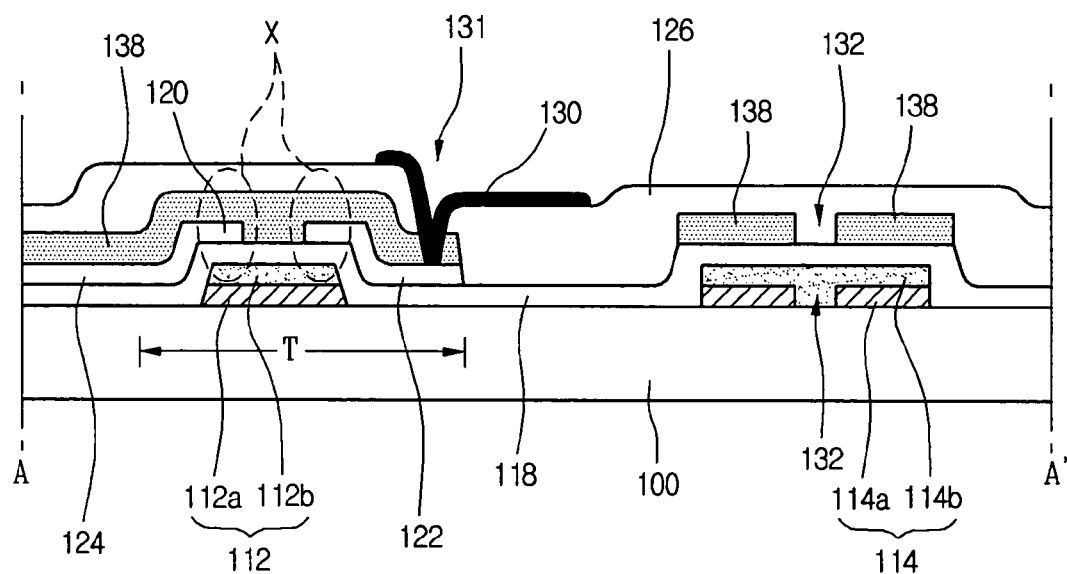
FIG. 3 is a cross-sectional view taken along line A-A' in FIG. 2.

FIG. 2 is a plan view of an LCD according to another embodiment of the present invention. FIG. 3 is a cross-sectional view taken along line A-A' in FIG. 2. A structure of the OTFT used as the switching device of an active matrix type LCD will now be described with reference to FIGS. 2 and 3. As shown in FIG. 2, the LCD includes gate lines 114 and data lines 124 that cross each other to define a pixel region P. A TFT T is formed at a crossing of the gate line 114 and the data line 124, and a pixel electrode 130 is connected to the TFT T. Embodiments of present invention for an LCD device are characterized in that the switching device T is an organic thin film transistor (OTFT).

As shown in FIG. 3, the TFT T includes a gate electrode 112 branching off from the gate line 114, a gate insulating layer 118 formed on the gate electrode 112, a source electrode 120 branching off from the data line 124 on the gate insulating layer 118 toward the gate electrode 112, and a drain electrode 122 spaced apart from the source electrode 120 by a predetermined distance. An organic semiconductor layer 138 is formed on the source electrode 120 to form a channel for the TFT T. The organic semiconductor layer 138 is also formed on the gate line 114 and the data line 124.

A cut portion 132 is formed in the organic semiconductor layer 138 on the gate line 124. One or more cut portions 132 are formed in one pixel region P. The one or more cut portions 132 prevent leakage current through the organic semiconductor layer 138 on the gate line 12.

The gate line 114 and the gate electrode 112 can each be a dual-line structure, as indicated by reference numbers 114a, 114b, 112a and 112b. A first gate line layer 114a can be formed by depositing a metal material and then patterning the metal material. A second gate line layer 114b can be formed by depositing a transparent conductive electrode material and then patterning the transparent conductive electrode material. The first and second gate line layers 114a and 114b can also be formed by sequentially depositing the metal material, patterning the metal material, depositing the transparent conductive electrode material, and patterning the transparent conductive electrode material.

A cut portion 132 can also be formed in the first gate line layer 114a at a position corresponding to the cut portion 132 formed in the organic semiconductor layer 138. The second gate line layer 114b is formed on or beneath the cut portion 132. The second gate line layer 114b may be formed on the first line layer 114a. Alternatively, the first gate line layer 114a can be formed on the second gate line layer 114b.

The first gate line layer 114a can be formed of one of Al, Cu, Ta, Ti, Mo, Mo alloy, and Al alloy. The second gate line layer 114b can be formed of a transparent conductive electrode material such as ITO, IZO and ZnO. The organic semiconductor layer 138 can be formed of a hydrocarbon-based active material such as pentacene ($C_{22}H_{14}$), tetracene ($C_{18}H_{12}$), naphthalene ($C_{10}H_8$), and anthracene ($C_{14}H_{10}$).

A passivation layer 126 is formed on the organic semiconductor layer 138 to protect the semiconductor layer 138. The passivation layer 126 can be formed of an organic insulating material or an inorganic insulating material. A contact hole 131 in the passivation layer 126 exposes the drain electrode 122. More particularly, the contact hole 131 penetrates the passivation layer 126 and the organic semiconductor layer 138 to expose a portion of the drain electrode 122. A pixel electrode 130 is connected to the drain electrode 122 through the contact hole 131. The pixel electrode 130 is formed of a transparent conductive electrode material, such as ITO, IZO, ITZO and ZnO.

Figure 4A:
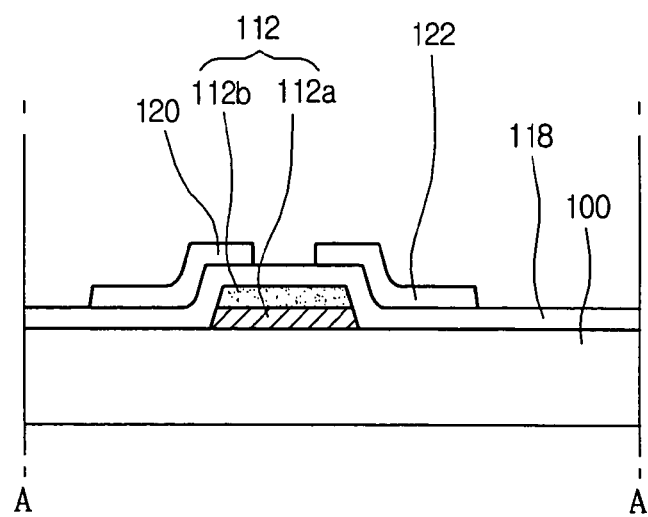
FIGS. 4A to 4E are cross-sectional views illustrating a method of fabricating an OTFT according to an embodiment of the present invention.

FIGS. 4A to 4E are cross-sectional views illustrating a process of fabricating an OTFT according to an embodiment of the present invention. As described above, the OTFT according to embodiments of the present invention is used as a switching device in an active matrix type organic electroluminescence device or an active matrix type LCD device. As shown in FIG. 4A, a gate line 114 and a gate electrode 112 are formed on a substrate 112. The gate line 114a and 114b and the gate electrode 112a and 112b are formed in a dual-line structure, which is a stack of a first gate line layer 114a and a second gate line layer 114b.

The first gate line layer 114a may be formed by depositing a metal material and then patterning the metal material. The second gate line layer 114b may be formed by depositing a transparent conductive electrode material and then patterning the transparent conductive electrode material. The first gate line layer 114a is formed on the second gate line layer 114b to form a dual-line structure. A cut portion 132 is formed in the first gate line layer 114a. One or more such cut portions 132 are provided in one pixel region P. The cut portion can be formed during the patterning of the first gate line layer 114a or by subsequent etching of the first gate line layer 114a. The first gate line layer 114a maybe formed of one of Al, Cu, Ta, Ti, Mo, Mo alloy, and Al alloy. The second gate line layer 114b maybe formed of a transparent conductive electrode material such as ITO, IZO and ZnO.

After the gate electrode 112 is formed, a gate insulating layer 118 is formed on the gate electrode 112. Source and drain electrodes 120 and 122 are formed at both sides of the gate electrode 112 on the gate insulating layer 118 such that they are spaced apart from each other by a predetermined distance. The source and drain electrodes 120 and 122 partially overlap the gate electrode 112.

Figure 4B:
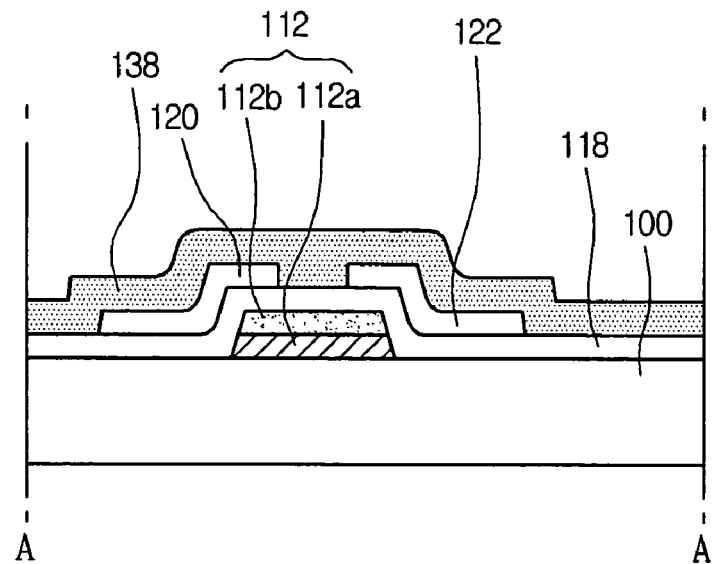

As illustrated in FIG. 4B, an organic semiconductor layer 138 is then deposited on the source and drain electrodes 120 and 122 by vacuum evaporation or spin coating. The organic semiconductor layer 138 may be formed of a hydrocarbon-based active material, such as pentacene ($C_{22}H_{14}$), tetracene ($C_{18}H_{12}$), naphthalene ($C_{10}H_8$) and anthracene ($C_{14}H_{10}$).

Figure 4C:
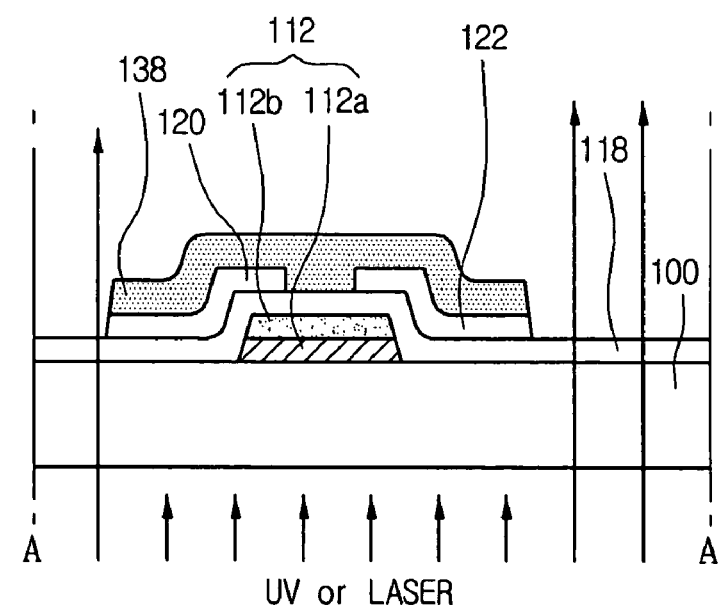

As illustrated in FIG. 4C, a laser light or a UV light is then irradiated onto a backside of the substrate 100. The organic semiconductor layer 138, except for a portion covered by the gate electrode 112, and the source and drain electrodes 120 and 122, is exposed to laser light or UV light through the substrate 100 such that semiconductor characteristic of the exposed organic semiconductor layer 138 is deactivated so as to become insulating. Then, the deactivated portions of the of the exposed organic semiconductor layer 138 are selectively etched. Accordingly, the organic semiconductor layer 138 is self-patterned by the backside exposure without using an additional patterning process. Therefore, the patterns of the unexposed organic semiconductor layer 138 remains on the data line 124, the gate line 114, the source and drain electrodes 120 and 122, and the gate electrode 112.

During the backside exposure, the laser light or the UV light also penetrates through the cut portion 132 in the first gate line layer 114a such that the organic semiconductor layer 138 is exposed in the cut portion 132 of the gate line 114. This exposure deactivates the semiconductive properties of the organic semiconductor layer 138 in the cut portion 132 so as to make the organic semiconductor layer 138 in the cut portion 132 to be an insulator. Then, the deactivated portions of the of the exposed organic semiconductor layer 138 are selectively etched. Such a process prevents leakage current in the organic semiconductor layer 138 on the gate line 12.

Figure 4D:
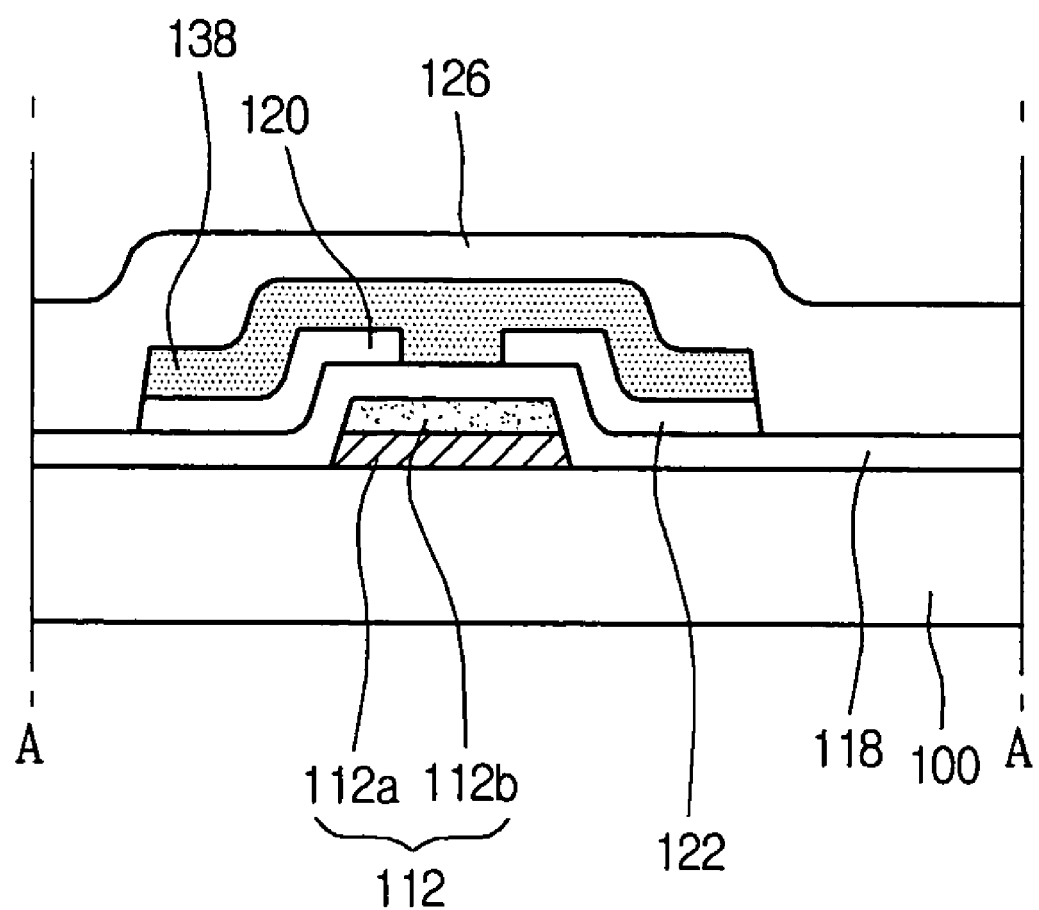

As illustrated in FIG. 4D, a passivation layer 126 is then deposited on the organic semiconductor layer 138 to protect the semiconductor layer 138. The passivation layer 126 may be formed of an organic insulating material or an inorganic insulating material.

Figure 4E:
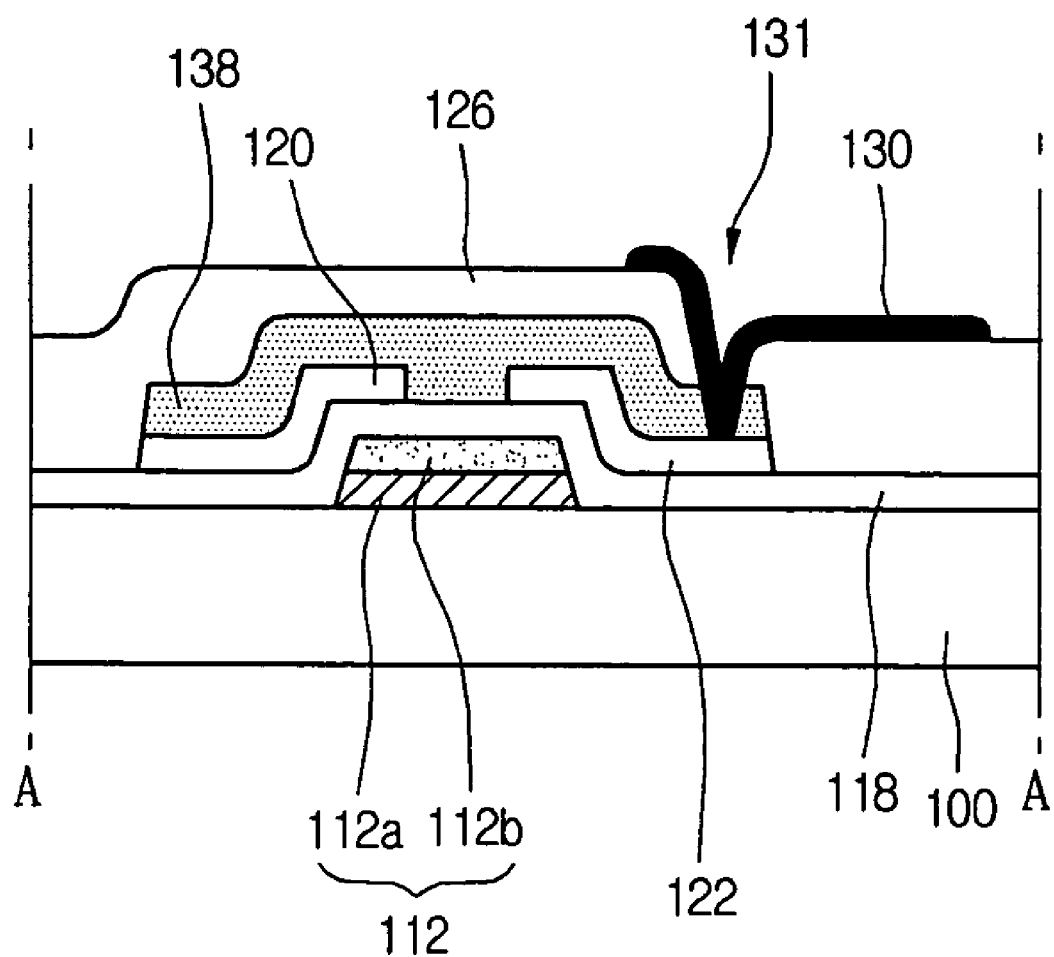

As illustrated in FIG. 4E, a contact hole 131 is then formed to penetrate the passivation layer 126 and the organic semiconductor layer 138 to expose the drain electrode 122. Subsequently, a pixel electrode 130 is formed in the contact hole 131. The pixel electrode 130 is connected to the drain electrode 122 through the contact hole 131.

As described above, embodiments of present invention can eliminate a patterning step in the formation of an OTFT for either an OLED device or an LCD device, thereby enhancing the production yield and reducing production costs. Also, embodiments of the present invention pattern an organic semiconductor layer by backside exposure of a substrate. Further, embodiments of the present invention can suppress a photocurrent of an organic semiconductor layer and a leakage current by backside exposure of a substrate to deactivate semiconductor characteristics in portions of the organic semiconductor layer and later remove those portions, thereby enhancing device characteristics.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A display device comprising:
   a gate line and a gate electrode formed on a substrate, the gate line and the gate electrode being formed of a stack of a first gate line layer and a second gate line layer;
   a gate insulating layer on the gate electrode;
   a data line crossing the gate line on the gate insulating layer to define a pixel region;
   source and drain electrodes partially overlapping the gate electrode;
   an organic semiconductor layer on the source and drain electrodes and the data line;
   a passivation layer on the organic semiconductor layer including a contact hole exposing the drain electrode; and
   a pixel electrode on the passivation layer and connected through the contact hole to the drain electrode, wherein the first gate line layer includes a cut portion,
   wherein the source electrode protrudes from the data line.

2. The display device according to claim 1, wherein the first gate line layer is formed of metal and the metal includes one of Al, Cu, Ta, Ti, Mo, Mo alloy, and Al alloy.

3. The display device according to claim 1, wherein the second gate line layer is formed of a transparent conductive electrode material and the transparent conductive electrode material includes one of ITO, IZO, ZnO, and ITZO.

4. The display device according to claim 1, wherein one or more cut portions are provided in the pixel region.

5. The display device according to claim 1, wherein a portion of the organic semiconductor layer corresponding to the cut portion is removed.

6. The display device according to claim 1, wherein the display device includes a liquid crystal display device or an organic electroluminescence device.

7. A method of fabricating a display device, the method comprising:

forming a gate line and a gate electrode on a substrate, the gate line and the gate electrode being formed of a stack of a first gate line layer and a second gate line layer;

forming a gate insulating layer on the gate electrode;

forming a data line crossing the gate line on the gate insulating layer to define a pixel region, and source and drain electrodes protruding from the data line to partially overlap the gate electrode;

forming an organic semiconductor layer on the front side of the substrate;

irradiating light onto the backside of the substrate;

forming a passivation layer on the organic semiconductor layer, the passivation layer including a contact hole exposing the drain electrode; and forming a pixel electrode on the passivation layer and connected through the contact hole to the drain electrode, wherein the first gate line layer includes a cut portion.

8. The method according to claim 7, wherein the organic semiconductor layer remains on the source and drain electrodes and the data line.

9. The method according to claim 7, wherein the first gate line layer is formed of metal.

10. The method according to claim 7, wherein the second gate line layer is formed of a transparent conductive electrode material.

11. The method according to claim 7, wherein the second gate line layer is formed on the first gate line layer.

12. The method according to claim 7, wherein the first gate line layer is formed on the second gate line layer.

13. The method according to claim 7, wherein one or more cut portions are provided in the pixel region.

14. The method according to claim 7, wherein a portion of the organic semiconductor layer corresponding to the cut portion is deactivated so as to become insulating.

15. The method according to claim 7, wherein a portion of the organic semiconductor layer corresponding to the cut portion is removed.

16. The method according to claim 7, wherein the display device includes a liquid crystal display device or an organic electroluminescence device.

* * * * *